(12) United States Patent
Chmielewski et al.

(10) Patent No.: US 7,560,934 B1
(45) Date of Patent: Jul. 14, 2009

(54) MRI COIL ELEMENT DECOUPLING UTILIZING MULTIPLE FEEDS

(75) Inventors: Thomas Chmielewski, Stow, OH (US); Brian J. Cohen, Stow, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 0 days.

(21) Appl. No.: 12/123,020

(22) Filed: May 19, 2008

Related U.S. Application Data

(60) Provisional application No. 60/938,711, filed on May 18, 2007.

(51) Int. Cl.
*G01V 3/00* (2006.01)
(52) U.S. Cl. .......................... 324/322; 324/318
(58) Field of Classification Search .................. 324/322, 324/318
See application file for complete search history.

(56) References Cited

U.S. PATENT DOCUMENTS

| | | | | | |
|---|---|---|---|---|---|
| 3,703,685 | A | * | 11/1972 | Simopoulos et al. | ........ 455/273 |
| 3,748,588 | A | * | 7/1973 | Beurrier | ...................... 330/254 |
| 4,343,405 | A | * | 8/1982 | Virte et al. | ............... 211/88.01 |
| 4,691,164 | A | * | 9/1987 | Haragashira | ................ 324/322 |
| 5,669,068 | A | * | 9/1997 | Kielmeyer et al. | ............ 455/83 |
| 5,900,730 | A | * | 5/1999 | Kim et al. | ................... 324/248 |
| 6,642,794 | B2 | * | 11/2003 | Mulder et al. | ............... 330/295 |

* cited by examiner

*Primary Examiner*—Louis M Arana
(74) *Attorney, Agent, or Firm*—Ulmer & Berne LLP

(57) ABSTRACT

An MRI system includes a receive coil having a coil element. Two preamplifiers are used in relation to the coil element, thus placing a large impedance in series with the coil element. The optimal noise impedance of each preamplifier is matched to that of the other preamplifier.

20 Claims, 2 Drawing Sheets

MRI COIL ELEMENT DECOUPLING UTILIZING MULTIPLE FEEDS

RELATED APPLICATION

The present application claims priority of U.S. Provisional Patent Application Ser. No. 60/938,711 filed May 18, 2007 and hereby incorporates the same Application herein by reference.

TECHNICAL FIELD

Embodiments relate to decoupling elements within a radio frequency receive coil for use with magnetic resonance imaging.

BACKGROUND

Magnetic resonance imaging (MRI) is a medical diagnostic imaging technique used to diagnose many types of injuries and medical conditions. An MRI system includes a main magnet for generating a main magnetic field through an examination region. The main magnet is arranged such that its geometry defines the examination region. The orientation of the main magnet defines whether the MRI system is classified as a horizontal field system or a vertical field system. In a horizontal field system, the static main magnetic field is typically oriented in the head-foot (H-F) direction relative to the prone/supine patient within the system. In a vertical field system, the static magnetic field is typically oriented in an anterior-posterior (A-P) direction relative to the prone/supine patient within the system.

The main magnetic field causes the magnetic moments of a small majority of the various nuclei within the body to be aligned in a parallel or anti-parallel arrangement. The aligned magnetic moments rotate around an equilibrium axis with a frequency that is characteristic for the nuclei to be imaged. An external radiofrequency (RF) field is applied as a pulse by other hardware within the MRI system. The RF pulse perturbs the magnetization from its equilibrium state. Upon termination of the application of the RF pulse, the magnetization relaxes to its initial state. During relaxation, a time varying magnetic moment is introduced which induces a detectable time varying voltage. The time varying voltage can be detected by a receive coil (e.g., an imaging coil).

The receive coil typically comprises one or more coil elements. Each coil element can typically comprise a continuous piece of copper formed in a loop, butterfly, figure-eight, or other continuous geometric shape. Each coil element can include inductive and capacitive elements. The coil elements can be positioned at various locations throughout the receive coil to provide for a desired imaging of the patient. The coil elements operate by resonating and efficiently storing energy at particular frequencies commonly called a Larmor frequency. The particular Larmor frequency at which the coil elements operate can depend upon the particular object being imaged (e.g., a knee, a brain). The design of the receive coil can vary based upon its use in a vertical or horizontal field MRI system.

One or more RF receive coils are typically placed within the vicinity of a patient to facilitate magnetic resonance imaging. During operation of the receive coil, each coil element collects information from the time varying voltage induced by the magnetic moments from the patient's anatomy that is nearest to each coil element. The information collected by each coil element is processed through the electronics associated with the MRI system. The information from each coil element can be on an individual MRI system channel to keep the information from each coil element separate during the imaging process. The information from each MRI system channel can be processed by reconstruction software associated with the MRI system. The reconstruction software can combine the single images from the MRI system channels to create an overall image of a patient's anatomy being imaged.

The shape, configuration, and/or location of coil elements can affect the characteristics of the receive coil, such as sensitivity, signal-to-noise ratio (SNR), and imaging field-of-view (FoV) (e.g., distance between two points on the receive coil's sensitivity profile where the signal drops to 80% of its peak value). Smaller coil elements typically provide higher sensitivity and SNR, but decreased FoV, while larger coil elements provide lower sensitivity and SNR, with an increased FoV. Considering this, receive coils commonly utilize numerous smaller elements positioned over the entirety of the receive coil, rather than very few larger elements that cover the entirety of the receive coil.

When two coil elements of a receive coil having the same resonance frequency are brought into close proximity to one another, the common resonance frequency can split into two separate frequencies (e.g., due to the electromagnetic interaction or coupling between the two coil elements). Two coil elements are considered to be magnetically coupled if each coil element induces a net non-zero magnetic flux linkage in the other coil element. However, two coil elements are considered to be magnetically de-coupled, or isolated, if each coil element induces a net zero magnetic flux linkage in the other (e.g., completely nullifying the magnetic flux linkage between each other). Generally, the closer the coil elements are in proximity with each other, the stronger the resulting magnetic coupling is. When two or more coil elements are in close proximity with each other, the coil element can magnetically couple, thereby causing sensitivity degradation in a receive coil having a maximum sensitivity that is optimized for a particular, relatively narrow, band of frequencies.

Within the art, attempts have been made to isolate coil elements that are in close proximity to each other within an RF receive coil. It is known within the art that coil elements are commonly decoupled from one another by using the geometry and configuration of the elements, by overlapping elements, or by using capacitive or inductive decoupling. Coil element isolation has also been achieved using separate preamplifiers with respective coil elements of a receive coil (e.g., commonly known as preamp decoupling). Conventional isolation techniques are limited by the amount of preamp isolation and/or geometric isolation that can be achieved. Also, these conventional receive coil isolation arrangements often require the receive coil and coil elements to be properly loaded. Proper loading is oftentimes accomplished by placing an appropriate patient anatomy or a phantom load (e.g., simulation of the load commonly associated with a particular patient anatomy) within the receive coil during the receive coil tuning and isolation of the receive coil. Conventional isolation techniques are not desensitized to this receive coil loading of the receive coil. Additionally, conventional isolation techniques do not facilitate optimal tuning of a receive coil that is designed to accept different loads (e.g., a receive coil that is designed to image the knee on certain occasions, and the ankle on other occasions).

SUMMARY

In accordance with one embodiment, a method is provided for decoupling elements within a radio frequency receive coil for use in magnetic resonance imaging. The method comprises, for at least one element of the receive coil, connecting a first preamplifier to the element and connecting a second preamplifier to the element. The optimal noise impedance of each of the first and second preamplifiers is matched.

In accordance with another embodiment, a magnetic resonance imaging system comprises a receive coil, a first preamplifier, and a second preamplifier. The receive coil comprises a plurality of elements. Each element is configured to collect information from within the anatomy of a patient. The first preamplifier is connected to one of the elements. The second preamplifier is connected to the one of the elements. The optimal noise impedance of each of the first and second preamplifiers is matched.

In accordance with yet another embodiment, a magnetic resonance imaging system comprises a receive coil, a first preamplifier circuit, a second preamplifier circuit, and a linear combination arrangement. The receive coil comprises a plurality of elements. Each element is configured to collect information from within the anatomy of a patient. The first preamplifier circuit is connected with one of the elements and is configured to generate a first output signal. The first preamplifier circuit comprises a first preamplifier, at least one first capacitor, and at least one first inductor. The second preamplifier circuit is connected with the one of the elements and is configured to generate a second output signal. The second preamplifier circuit comprises a second preamplifier, at least one second capacitor, and at least one second inductor. The linear combination arrangement is configured to combine the first and second output signals. The optimal noise impedance of each of the first and second preamplifiers is matched.

BRIEF DESCRIPTION OF THE DRAWINGS

It is believed that certain embodiments will be better understood from the following description taken in conjunction with the accompanying drawings in which.

DETAILED DESCRIPTION

Figure 1:
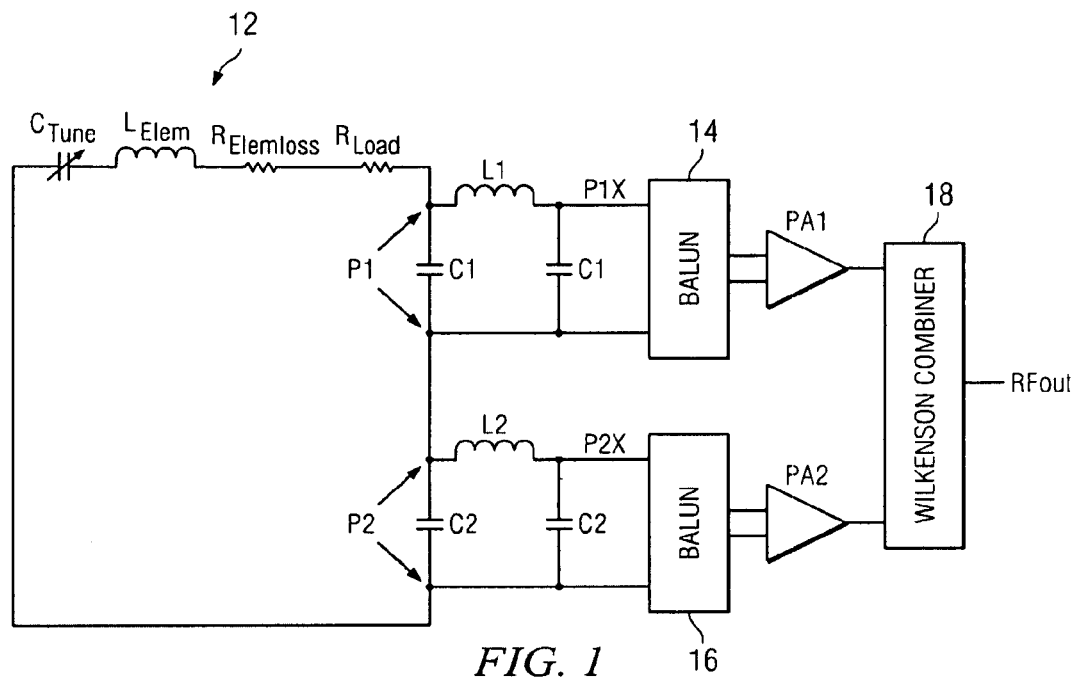
FIG. 1 is a circuit diagram illustrating a circuit in accordance with one embodiment.
Figure 2:
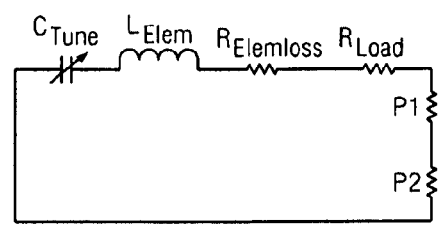
FIG. 2 is a circuit diagram illustrating loading on a portion of the circuit of FIG. 1.

Embodiments are hereinafter described in detail in connection with the views and examples of FIGS. 1-4, wherein like numbers indicate the same or corresponding elements throughout the views. An MRI system in accordance with one embodiment can be configured to diagnose many types of injuries and medical conditions of a patient. The MRI system can include a main magnet which generates a main magnetic field through an examination region. In one embodiment, the main magnet can be arranged such that the MRI system is classified as a horizontal field system though, in another embodiment, the main magnet can be arranged such that the MRI system is classified as a vertical field system. In still other embodiments, an MRI system can have any of a variety of other configurations.

The MRI system can also include one or more receive coils, commonly called imaging coils, which are typically placed within the vicinity of a patient during imaging. The receive coil typically comprises one or more coil elements. Each coil element can typically comprise a continuous piece of copper formed in a loop, butterfly, figure-eight, or other continuous geometric shape. Each coil element can include inductive and capacitive elements. The coil elements can operate by resonating and efficiently storing energy at a particular frequency (e.g., commonly known as the Larmor frequency). The elements can be positioned at various locations throughout the receive coil to provide for the desired imaging of the patient. It will be appreciated that the design of the receive coil can very depending upon whether it will be used with a vertical or horizontal field MRI system and/or the type of anatomy of a patient which would be imaged by the receive coil.

During operation of the receive coil, each coil element can collect information from the patient's anatomy that is nearest to that coil element (e.g., from the time varying voltage induced by the magnetic moments). The MRI system includes electronics which receive and process, on individual channels, the information collected by each element of the receive coil(s). Through use of the individual channels, information from the respective elements can be maintained separately. The information from each channel can then be processed by reconstruction software associated with the MRI system to combine the separated information from each channel to create an overall image of the patient's anatomy of interest.

In accordance with one embodiment, one of the coil elements can be isolated such that its presence is unlikely to affect the collection of information by other coil elements of a particular receive coil. To achieve this result, at least two preamplifiers can be associated with the coil element. Each preamplifier can include an input impedance and an optimal noise impedance and can be configured such that the input impedance is substantially equal to the optimal noise impedance. The optimal noise impedance of each preamplifier can be matched to the other preamplifier(s) associated with a particular coil element. A high insertion impedance can be associated with each preamplifier (e.g., by associated inductors(s) and/or capacitors with the preamplifier, as discussed below), such that a high effective impedance is placed in series with the coil element. Such an arrangement can result in isolation of the coil element, such that the coil element is magnetically transparent to other coil elements within close proximity. It will be appreciated that a preamplifier can have any of a variety of suitable input impedances and can be associated with any of a variety of suitable insertion impedances.

In one embodiment, the optimal noise impedance for each preamplifier can be a function of the input impedance of the preamplifier and the number of preamplifiers associated with a given coil element. In particular, the optimal noise impedance for a preamplifier can be equal to the input impedance of the preamplifier divided by the number of preamplifiers associated with a coil element minus one. For example, if "n" represents an integer, and "n" preamplifiers are used with a coil element, the optimal noise impedance of each of the "n" preamplifiers can be $Z_{in}/("n"-1)$, where $Z_{in}$ is the input impedance of each preamplifier. Thus, in one embodiment in which two preamplifiers are associated with a coil element, the optimal noise impedance of the first preamplifier can be equal to the input impedance of the first preamplifier, and the optimal noise impedance of the second preamplifier can be equal to the input impedance of the second preamplifier. In some embodiments, the preamplifiers and assembled components (e.g., capacitors and inductors) as discussed below can be arranged separately from the coil element (e.g., in a separate housing). However, in other embodiments, the preamplifiers and associated components may be arranged integral with the coil element, which may or may not include a high impedance break point.

In accordance with one embodiment, FIG. 1 shows a circuit diagram illustrating a first preamplifier PA1 and second preamplifier PA2 associated with a coil element 12. The coil element 12 can include an electrically continuous piece of copper. It will be appreciated that various other components (e.g., electrical circuits, intelligence) can be associated with the coil element 12 to facilitate proper operation of the coil element 12 as known in the art. The coil element 12 is shown electrically in FIG. 1 to include an inductance $L_{Elem}$ and a resistance $R_{Elemloss}$. Additionally, a resistance of the load applied to the receive coil $R_{Load}$, is shown in series with the coil element. It will be appreciated that the inductance $L_{Elem}$, resistance $R_{Elemloss}$, and resistance $R_{Load}$ can affect the tuning of the coil element 12. In certain embodiments, such as shown in FIG. 1, the coil element 12 can include a variable capacitor $C_{Tune}$ to facilitate tuning of the coil element 12. Such tuning can be useful for achieving a particular Larmor frequency or compensating for manufacturing tolerances of the components used in constructing the element 12.

In use of an MRI system having a receive coil including the element 12, an electrical signal is generated by the element 12. In accordance with one embodiment, the signal generated by the element 12 is examined at two points P1 and P2, as shown in FIG. 1. Points P1 and P2 are commonly located in near proximity to each other as shown, for example, in the embodiment of FIG. 1. However, points P1 and P2 may be separated from one another about the element 12 as shown, for example, in the embodiment of FIG. 3. It will be appreciated that increased separation between points P1 and P2 can further reduce the possibility of coupling.

Figure 3:
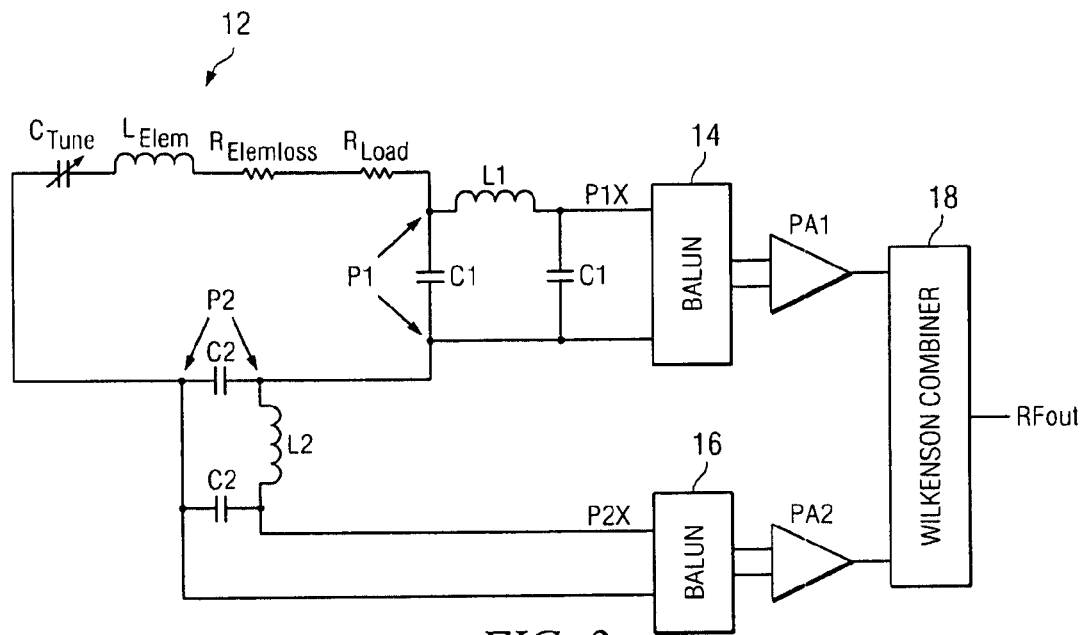
FIG. 3 is a circuit diagram illustrating a circuit in accordance with another embodiment.
Figure 4:
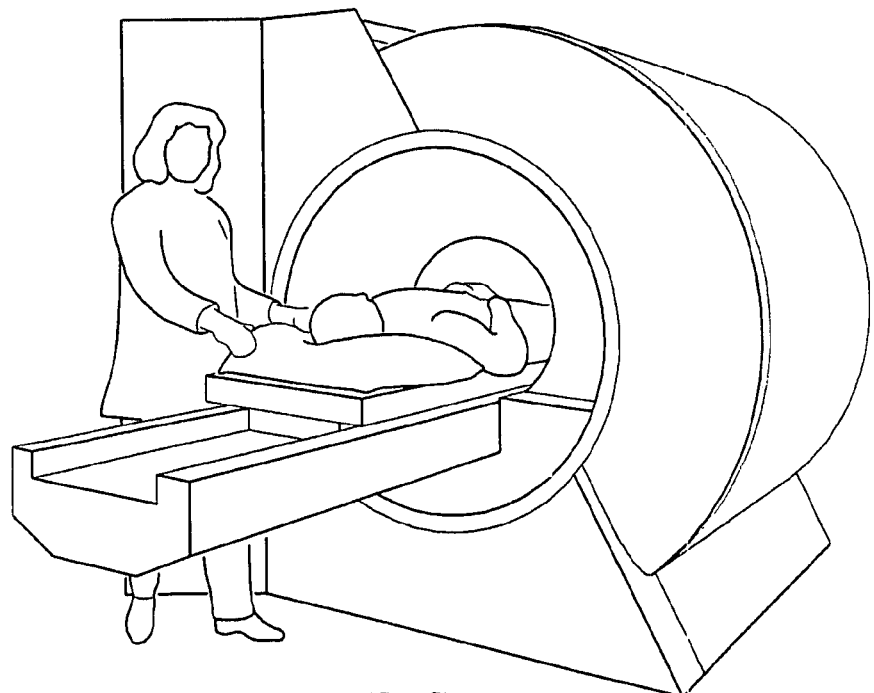
FIG. 4 is a perspective view depicting an MRI system of a type which can incorporate one or both of the circuits of FIGS. 1 and 3.

As shown in FIGS. 1 and 3, a first insertion impedance can be associated with the first preamplifier PA1 and a second insertion impedance can be associated with the second preamplifier PA2. In one embodiment, the first insertion impedance can include an inductor L1 and capacitors C1 and can be provided between the coil element 12 and the first preamplifier PA1. The second insertion impedance can include an inductor L2 and capacitors C2 and can be provided between the coil element 12 and the second preamplifier PA2. The combination of the first insertion impedance and the first preamplifier PA1 can provide a first effective impedance (e.g., P1 illustrated in FIG. 2) seen by the coil element 12. In addition, the combination of the second insertion impedance and the first preamplifier PA2 can result in a second effective impedance (e.g., P2 illustrated in FIG. 2) seen by the coil element 12.

The first and second effective impedances can be much greater than $R_{Load}$ and $R_{Elemloss}$ such that the signal generated by the coil element 12 is nearly entirely transmitted to the first and second preamplifiers PA1, PA2 (e.g., through translation over the first and second insertion impedances P1, P2). The first and second insertion impedances can also be configured to match such that each preamplifier PA1 and PA2 sees the same effective impedance. In one embodiment, the first and second impedances P1, P2 are equivalent, and are $x*R_o$ (e.g., input impedance of each preamplifier, $R_o$, multiplied by the respective impedance of the associated insertion impedance).

As shown in FIGS. 1 and 3, the signal at P1, which corresponds with be the input signal of first preamplifier PA1, and the signal at P2, which corresponds with the input signal of second preamplifier PA2, are respectively transformed by the first and second insertion impedances. The high impedance signal at point P1X can be fed through a balun 14 to the input of the first preamplifier PA1. Likewise, the high impedance signal at P2X can be fed through a balun 16 to the input of the second preamplifier PA2. Feeding the high impedance signals through the separate baluns 14, 16 can transform the resultant input impedances down to the optimal noise impedances of $R_o$ ohms. The baluns 14, 16 can comprise coax baluns which are commonly known in the art.

In certain embodiments, the preamplifiers PA1 and PA2 can be any type of low-noise preamplifiers used to obtain high insertion impedance while compromising optimal noise impedance. In further embodiments, to achieve the desired results, higher noise preamplifiers may be used, compromising higher insertion impedance, to gain increased optimal noise impedance. In accordance with one embodiment, the optimal noise impedance of the preamplifiers PA1 and PA2 can be equal to the optimal noise impedances of $R_o$. In such circumstance, at or near the resonant frequency, the inductive impedance ($X_L$) and capacitive impedance ($X_C$) can cancel.

The output signals of the preamplifiers PA1 and PA2 can be routed to the MRI receivers, or can be combined using any linear combination technique known in the art to obtain comparable signal-to-noise-ratio (SNR) to the classical receive coil element with optimized load. In one embodiment, as shown in FIGS. 1 and 3, a Wilkenson combiner 18 can combine the output signals of the preamplifiers PA1 and PA2. However, a linear combination of the output signals of the preamplifiers PA1 and PA2 can be achieved through use of any of a variety of alternative components or arrangements thereof. The output radio frequency signal (e.g., RFout) of the linear combination is commonly subsequently processed by the MRI system to contribute to an image produced by the MRI system.

When comparing the effectiveness of the decoupling of a coil element, the coil element is often imaged separately to eliminate interference from any other coil element, and the signal-to-noise ratio (SNR) of the coil element is computed. The same coil element is then imaged in relation to a second coil element at a certain distance away, and the SNR of the coil element of interest is again computed. The SNR of the coil element with no interference is then compared with the SNR of the coil element in close proximity to the second coil element to determine the effectiveness of the decoupling. It is not uncommon for a receive coil decoupled by conventional methods to have an SNR degradation of 30% or more, depending upon coil element size and loading, when separated by approximately 4 cm from another coil element. When a first coil element is decoupled in accordance with one embodiment, such as in the arrangement of FIG. 1, the SNR of the first coil element can have only approximately a 3% degradation when provided 4 cm apart from a second coil element which is similar to the first coil element, and can have only approximately a 7% degradation when provided 1 cm apart from the second coil element. Also, there might be no detectable distortion in any image provided by the first coil element due to the proximity of the second coil element.

It will be appreciated that, in achieving isolation between coil elements of a receive coil, certain embodiments can desensitize the coil elements to patient loading, and can facilitate arbitrary placement of coil elements and movement of coil elements relative to each other, while still achieving near ideal image quality. Accordingly, image quality can be determined by the ideal sensitivity of the receive coil. SNR, and thus the quality of the image, can therefore only be limited by the correlated patient noise.

In vertical field systems, large coil elements couple significantly to other coil elements no matter the orientation, though implementation of the embodiment of FIG. 1 or 3 can allow the coil elements to be placed closer to each other and make it easier to isolate other orthogonal elements. For both horizontal and vertical field systems, any application where coil coupling can impact image quality can be improved. One example is that a wrist or elbow can be placed between two parallel coil elements with no degradation due to coil isolation, and both coil coil elements will behave as though the other were not present. This is currently not possible with conventional systems without spacing the coils relatively far from one another. Embodiments can provide for optimal coil element isolation for MRI systems which include receive coils having solenoid elements placed in close proximity to each other (e.g., for imaging a wrist or elbow of a patient) and/or for receive coils which perform variable loading situations. When any phased array coil elements must perform for variable loads, the load SNR variability can be removed in accordance with one embodiment, and will thus only depend upon the ideal penetration of the coil elements.

Embodiments can facilitate significantly simplified design and manufacture of a receive coil. When designing a receive coil in accordance with one embodiment, no coil element matching might be required, provided that the receive coil is near resonance. Tuning of the receive coil might also not be required, such as if 5% components are used. Therefore, in accordance with certain embodiments, it might not be necessary to match or tune a receive coil during the manufacturing process.

Embodiments can provide for coil element isolation that is not limited by the amount of preamp isolation achievable and the geometrical isolation achievable, and can therefore achieve isolation superior to that of conventional systems or methods. It will be appreciated that embodiments (e.g., such as those shown in FIGS. 1 and 3) can be provided for use with vertical or horizontal field MRI systems having any of a variety of suitable field strengths and receive coil configurations (see, e.g., the MRI system of FIG. 4). It will therefore be appreciated that such embodiments are not limited to any particular receive coil geometry, or to imaging any particular portion of a patient's anatomy, or to any type of patient (e.g., human, animal, phantom). It will also be appreciated that such embodiments can be applied to a single coil element within a receive coil, multiple coil elements within a receive coil, all coil elements within a receive coil, or in relation to any number of coil elements within a receive coil, while conventional isolation techniques might be used with one or more of the same and/or other coil elements of the receive coil. Thus, the embodiments of FIGS. 1 and 3, for example, can be used as the sole method of decoupling coil elements of one or more receive coils, or may alternatively be used in combination with one or more conventional isolation techniques.

The foregoing description of embodiments and examples has been presented for purposes of illustration and description. It is not intended to be exhaustive or to limit the invention to the forms described. Numerous modifications are possible in light of the above teachings. Some of those modifications have been discussed and others will be understood by those skilled in the art. The embodiments were chosen and described in order to best illustrate certain principles and various embodiments as are suited to the particular use contemplated. The scope of the invention is, of course, not limited to the examples or embodiments set forth herein, but can be employed in any number of applications and equivalent devices by those of ordinary skill in the art. Rather it is hereby intended the scope of the invention be defined by the claims appended hereto.

What is claimed is:

1. A method for decoupling coil elements within a radio frequency receive coil for use in magnetic resonance imaging, the method comprising, for at least one coil element of the receive coil:
   connecting a first preamplifier to the coil element; and
   connecting a second preamplifier to the coil element;
   wherein the optimal noise impedance of each of the first and second preamplifiers is matched.

2. The method of claim 1 wherein the connecting of the first and second preamplifiers to the coil element comprises placing a large effective impedance in series with the coil element.

3. The method of claim 1 wherein the connecting of the first and second preamplifiers to the coil element comprises connecting at least one inductor and at least one capacitor between the first preamplifier and the coil element and connecting at least one inductor and at least one capacitor between the second preamplifier and the coil element.

4. The method of claim 3 wherein the connecting of the first and second preamplifiers to the coil element further comprises connecting, for each of the first and second preamplifiers, a respective balun.

5. The method of claim 1 further comprising providing a linear combination arrangement configured to combine output signals of the first and second preamplifiers into an output radio frequency signal.

6. The method of claim 5 wherein the linear combination arrangement comprises a Wilkenson combiner.

7. The method of claim 5 further comprising processing the output radio frequency signal to contribute to an image.

8. The method of claim 1 for multiple respective coil elements of the receive coil.

9. A magnetic resonance imaging system comprising:
   a receive coil, the receive coil comprising a plurality of coil elements, each coil element configured to collect information from within the anatomy of a patient;
   a first preamplifier connected to one of the coil elements; and
   a second preamplifier connected to the one of the coil elements;
   wherein the optimal noise impedance of each of the first and second preamplifiers is matched.

10. The magnetic resonance imaging system of claim 9 comprising a large effective impedance in series with the one of the coil elements and in relation to the first and second preamplifiers.

11. The magnetic resonance imaging system of claim 9 further comprising at least one first capacitor and at least one first inductor connected with the one of the coil elements and the first preamplifier, and at least one second capacitor and at least one second inductor connected with the one of the coil elements and the second preamplifier.

12. The magnetic resonance imaging system of claim 11 further comprising a first balun and a second balun, wherein the first balun is connected with the first preamplifier, and the second balun is connected with the second preamplifier.

13. The magnetic resonance imaging system of claim 9 wherein a quantity of preamplifiers, including the first and second preamplifiers, is associated with the one of the coil elements, each of the preamplifiers of the quantity of preamplifiers has a preamplifier input impedance and a preamplifier optimal noise impedance, and the preamplifier optimal noise impedance is equal to the preamplifier input impedance divided by the quantity of preamplifiers minus one.

14. The magnetic resonance imaging system of claim 9 wherein the optimal noise impedance of the first preamplifier is equal to the input impedance of the first preamplifier, and wherein the optimal noise impedance of the second preamplifier is equal to the input impedance of the second preamplifier.

15. The magnetic resonance imaging system of claim 9 further comprising a linear combination arrangement configured to combine output signals of the first and second preamplifiers into an output radio frequency signal.

16. The magnetic resonance imaging system of claim 15 wherein the linear combination arrangement comprises a Wilkenson combiner.

17. A magnetic resonance imaging system comprising:
   a receive coil, the receive coil comprising a plurality of coil elements, each coil element configured to collect information from within the anatomy of a patient;
   a first preamplifier circuit connected with one of the coil elements and configured to generate a first output signal, the first preamplifier circuit comprising a first preamplifier, at least one first capacitor, and at least one first inductor;
   a second preamplifier circuit connected with the one of the coil elements and configured to generate a second output signal, the second preamplifier circuit comprising a second preamplifier, at least one second capacitor, and at least one second inductor; and
   a linear combination arrangement configured to combine the first and second output signals;
   wherein the optimal noise impedance of each of the first and second preamplifiers is matched.

18. The magnetic resonance imaging system of claim 17 wherein the first preamplifier circuit further comprises a first balun, and the second preamplifier circuit further comprises a second balun.

19. The magnetic resonance imaging system of claim 18 wherein the linear combination arrangement comprises a Wilkenson combiner.

20. The magnetic resonance imaging system of claim 18 wherein the first and second preamplifier circuits place a large impedance in series with the one of the coil elements.

* * * * *

UNITED STATES PATENT AND TRADEMARK OFFICE
CERTIFICATE OF CORRECTION

PATENT NO. : 7,560,934 B1
APPLICATION NO. : 12/123020
DATED : July 14, 2009
INVENTOR(S) : Thomas Chmielewski et al.

It is certified that error appears in the above-identified patent and that said Letters Patent is hereby corrected as shown below:

Column 6, line 66, change "FIG." to --FIGS.--.

Column 7, line 6, after "both" delete "coil".

Signed and Sealed this

Eighth Day of September, 2009

David J. Kappos
*Director of the United States Patent and Trademark Office*